United States Patent
Zhang et al.

(10) Patent No.: US 10,365,308 B2
(45) Date of Patent: Jul. 30, 2019

(54) WIDE DYNAMIC RANGE BROADBAND CURRENT MODE LINEAR DETECTOR CIRCUITS FOR HIGH POWER RADIO FREQUENCY POWER AMPLIFIER

(71) Applicant: SKYWORKS SOLUTIONS, INC., Woburn, MA (US)

(72) Inventors: Lisette L. Zhang, Irvine, CA (US); Oleksandr Gorbachov, Irvine, CA (US); Lothar Musiol, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 123 days.

(21) Appl. No.: 15/370,955

(22) Filed: Dec. 6, 2016

(65) Prior Publication Data

US 2017/0160318 A1  Jun. 8, 2017

Related U.S. Application Data

(60) Provisional application No. 62/264,802, filed on Dec. 8, 2015.

(51) Int. Cl.
*G01R 21/00* (2006.01)
*G01R 19/00* (2006.01)
*G01R 31/28* (2006.01)

(52) U.S. Cl.
CPC ......... *G01R 21/00* (2013.01); *G01R 19/0038* (2013.01); *G01R 31/2822* (2013.01)

(58) Field of Classification Search
CPC .............. H03F 1/26; H03F 2200/261; H03F 2200/513; H03F 2203/45138; H03F 2203/45288; H03F 2200/211; H03F 1/08; H03F 1/56; H03F 2200/222; H03F 2200/387; H03F 3/181; H03F 3/265;
(Continued)

(56) References Cited

U.S. PATENT DOCUMENTS 3,601,717 A * 8/1971 Kuecken ............... H03H 7/40
                                                    330/51
3,778,731 A * 12/1973 Oomen .................. H03H 7/40
                                                    333/17.1
(Continued)

OTHER PUBLICATIONS

PCT Search Report & Written Opinion for PCT/US2016/65654; dated Mar. 13, 2017.
(Continued)

*Primary Examiner* — Vinh P Nguyen
(74) *Attorney, Agent, or Firm* — Stetina Brunda Garred & Brucker

(57) ABSTRACT

A power detector with a detection signal input connectable to a source of a radio frequency signal and a detected power level output has a differential amplifier detector circuit with an input connected to the detection signal input and an output corresponding to the detected power level output. A feedback network is connected to the input and the output of the differential amplifier detector circuit. A mirror circuit is connected to the differential amplifier detector circuit. A root mean square current corresponding to a power level of the radio frequency signal from the source is mirrored and integrated, with a direct current voltage level being generated therefrom and output to the detected power level output.

22 Claims, 13 Drawing Sheets

(58) Field of Classification Search
CPC .. H03F 3/456; H03F 3/45932; H03F 3/45973; H03F 3/45977; H03F 3/45991; H03F 1/3211; H03F 3/45654; G01R 27/2605; G01R 19/0038; G01R 1/06772; G01R 1/06788; G01R 21/00; G01R 31/2822; G06F 3/044; G06F 3/0412; H03H 11/1217; H03H 3/00; H03H 11/48; H03H 11/481; H03H 11/53; H03H 7/25; H03H 7/40; H03H 11/1291; H03H 11/245; H03H 11/32; H03H 2007/0192; H03H 2011/0494; H03H 3/00; H03H 11/30
See application file for complete search history.

(56) References Cited

U.S. PATENT DOCUMENTS

| | | | |
|---|---|---|---|
| 7,469,133 B2 | 12/2008 | Zhang | |
| 7,917,104 B2 * | 3/2011 | Manssen | H01Q 1/242 455/115.1 |
| 8,299,867 B2 * | 10/2012 | Mckinzie, III | H03H 7/40 333/17.3 |
| 8,319,557 B2 | 11/2012 | Prikhodko et al. | |
| 8,385,853 B2 | 2/2013 | Prikhodko et al. | |
| 8,452,243 B2 | 5/2013 | Prikhodko et al. | |
| 8,655,286 B2 * | 2/2014 | Mendolia | H04B 1/0458 455/69 |
| 9,413,398 B2 | 8/2016 | Whittaker | |
| 9,500,681 B2 | 11/2016 | Boucey et al. | |
| 9,735,737 B2 * | 8/2017 | Gorbachov | H03F 1/0205 |
| 2010/0167670 A1 | 7/2010 | Gilbert | |
| 2011/0193550 A1 | 8/2011 | Eken et al. | |
| 2011/0285458 A1 | 11/2011 | Meyer | |

OTHER PUBLICATIONS

Skyworks Solutions, Inc., SE5005L:5 GHz Power Amplifier with Power Detector (data sheet), Apr. 3, 2013, 10 pages.

Texas Instruments Incorporated, AN-1375 Linear-In-dB RF Power Detector in W-CDMA User Equipment (Application Report SNWA002A), Apr. 2013, 9 pages, Dallas, Texas.

Jiayi Wang, Yongan Zheng, Fan Yang, Fan Tian, Huailin Liao, A Wide Band CMOS Radio Frequency RMS Power Detector with 42-dB Dynamic Range, 2015, 4 pages, Key Laboratory of Microelectronic Devices and Circuits (MOE), Institute of Microelectronics, Peking University, Beijing, China.

* cited by examiner

WIDE DYNAMIC RANGE BROADBAND CURRENT MODE LINEAR DETECTOR CIRCUITS FOR HIGH POWER RADIO FREQUENCY POWER AMPLIFIER

CROSS-REFERENCE TO RELATED APPLICATIONS

The application relates to and claims the benefit under 35 U.S.C. § 119(e) to U.S. Provisional Patent Application No. 62/264,802 filed Dec. 8, 2015 and entitled "WIDE DYNAMIC RANGE BROADBAND CURRENT MODE LINEAR DETECTOR CIRCUITS FOR HIGH POWER RF PA," the entire contents of which is wholly incorporated by reference herein.

STATEMENT RE: FEDERALLY SPONSORED RESEARCH/DEVELOPMENT

Not Applicable

BACKGROUND

1. Technical Field

The present disclosure relates generally to radio frequency integrated circuits, and more particularly, to wide dynamic range broadband current mode linear detector circuits for high power radio frequency power amplifiers.

2. Related Art

Wireless communications systems are utilized in a variety contexts involving information transfer over long and short distances alike, and a wide range of modalities for addressing the particular needs of each being known in the art. As a general matter, wireless communications involve a radio frequency (RF) carrier signal that is variously modulated to represent information/data, and the encoding, modulation, transmission, reception, de-modulation, and decoding of the signal conform to a set of standards for coordination of the same.

Many different mobile communication technologies or air interfaces exist, including GSM (Global System for Mobile Communications), EDGE (Enhanced Data rates for GSM Evolution), and UMTS (Universal Mobile Telecommunications System). Various generations of these technologies exist and are deployed in phases, with one common third generation (3G) UMTS-related modality referred to as UMTS-FDD (frequency division duplexing) being W-CDMA (Wideband Code Division Multiplexing). More recently, 4G (fourth generation) technologies such as LTE (Long Term Evolution), which is based on the earlier GSM and UMTS standards, are being deployed. Besides mobile communications modalities such as these, various communications devices incorporate local area data networking modalities such as Wireless LAN (WLAN)/WiFi. Along these lines, last-mile wireless broadband access technologies such as WiMAX (Worldwide Interoperability for Microwave Access) are also being implemented.

A fundamental component of any wireless communications system is the transceiver, that is, the combined transmitter and receiver circuitry. The transceiver encodes the data as a baseband signal and modulates the baseband signal with an RF carrier signal. Upon receipt, the transceiver down-converts the RF signal, demodulates the baseband signal, and decodes the data represented by the baseband signal. An antenna connected to the transmitter converts the electrical signals to electromagnetic waves, and an antenna connected to the receiver converts the electromagnetic waves back to electrical signals. Depending on the particulars of the communications modality, single or multiple antennas may be utilized.

Transceivers typically do not generate sufficient power or have sufficient sensitivity for reliable communications standing alone. Thus, additional conditioning of the RF signal is necessary. The circuitry between the transceiver and the antenna that provide this functionality is referred to as the front end, which is understood to include a power amplifier for increased transmission power, and/or a low noise amplifier for increased reception sensitivity. Additionally, there may be a RF switch that selectively connects the transmit chain (including the power amplifier), and the receive chain (including the low noise amplifier) tot the antenna. Each band or operating frequency of the communications system may have a dedicated power amplifier and low noise amplifier tuned specifically to that operating frequency.

Detecting and controlling the performance of an amplifier makes it possible to maximize the output power while achieving optimum linearity and efficiency, and so a power detector may be integrated into the front end circuit. The power detector is typically utilized in the transmit chain to monitor the output of the power amplifier, and generates a direct current (DC) voltage that is related to the measured power. This voltage is fed back to the transceiver, which uses it for signal strength indication. In turn, the proper gain may be set in a variable gain amplifier. A directional coupler may be connected to the output of the power amplifier, with one of its ports being connected to the input of the power detector.

In order to achieve higher output power, the size of the amplifier circuit, and in particular the transistors therefor, must be increased for optimal drain impedance, current handling capacity, and heat dissipation. The higher output power from the amplifier also impacts the power detector, as a wide dynamic range is needed for detecting both low and high output power with monotonically increasing voltage. Yet, the push for ever-decreasing size in mobile communications devices is at odds with larger integrated circuit components needed for handling higher power levels and incorporating more features.

Power detectors generally fall into one of two types—diode-based and logarithmic-based. There are several shortcomings with respect to conventional diode-based power detector circuits. Namely, the output voltage versus output power tends to follow a parabolic curve. Such power detectors also have narrow dynamic range and lack sufficient linearity across the entire output power range. In some cases, a complicated algorithm for baseband calibration is needed. A logarithmic power detector can be linear across a wider power detection range, but in order to achieve this, multiple cascaded attenuation and amplification stages with a final summation amplifier is necessary. Furthermore, the circuitry is complicated, and accordingly occupies a large footprint on the integrated circuit die. The logarithmic power detector also has a significantly higher current consumption for the wider power detection range, which adds to the challenges of achieving high power-added efficiency (PAE) of the overall power amplifier circuit.

Accordingly, there is a need in the art for an improved non-logarithmic power detector with wide dynamic range. Additionally, there is a need for power detectors with minimal physical size, and capable of operation with a variety of wireless communication modalities and the different signal types thereof.

BRIEF SUMMARY

Various embodiments of a power detector are disclosed. The power detector is non-logarithmic, and the linearity of the output voltage from the input power is maintained over a wide dynamic range, preferably over 40 dB. The power detector is operational with radio frequency input signals from below 10 MHz to over 10 GHz. Additionally, the integrated circuit is contemplated to occupy a footprint of less than 0.03 mm$^2$, with less than 2 mA of current consumption. Because of its operability over a wide range of input signal frequencies, supply voltages, and ambient temperatures, the complexity associated with baseband calibration in wireless communications systems is substantially reduced.

According to one embodiment of the present disclosure, there is a power detector with a detection signal input connectable to a source of a radio frequency signal, and a detected power level output. The power detector may include a differential amplifier detector circuit with an input connected to the detection signal input and an output corresponding to the detected power level output. Additionally, there may be a feedback network connected to the input and the output of the differential amplifier detector circuit. The power detector may further include a mirror circuit that is connected to the differential amplifier detector circuit. A root mean square current corresponding to a power level of the radio frequency signal from the source may be mirrored and integrated, with a direct current voltage level being generated therefrom and output to the detected power level output. The direct current voltage may be within a first predetermined voltage range between a low end and a high end and corresponding to the power level of the radio frequency signal.

Also contemplated in accordance with the present disclosure is a front end circuit with the aforementioned power detector, as well as a wireless communications device that incorporates such a power detector. The present disclosure will be best understood by reference to the following detailed description when read in conjunction with the accompanying drawings.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

The detailed description set forth below in connection with the appended drawings is intended as a description of the several presently contemplated embodiments of power detectors and radio frequency (RF) front end circuits utilizing the same, and are not intended to represent the only form in which the disclosed power detectors may be developed or utilized. The description sets forth the functions and features in connection with the illustrated embodiments. It is to be understood, however, that the same or equivalent functions may be accomplished by different embodiments that are also intended to be encompassed within the scope of the present disclosure. It is further understood that the use of relational terms such as first and second and the like are used solely to distinguish one from another entity without necessarily requiring or implying any actual such relationship or order between such entities.

Figure 1:
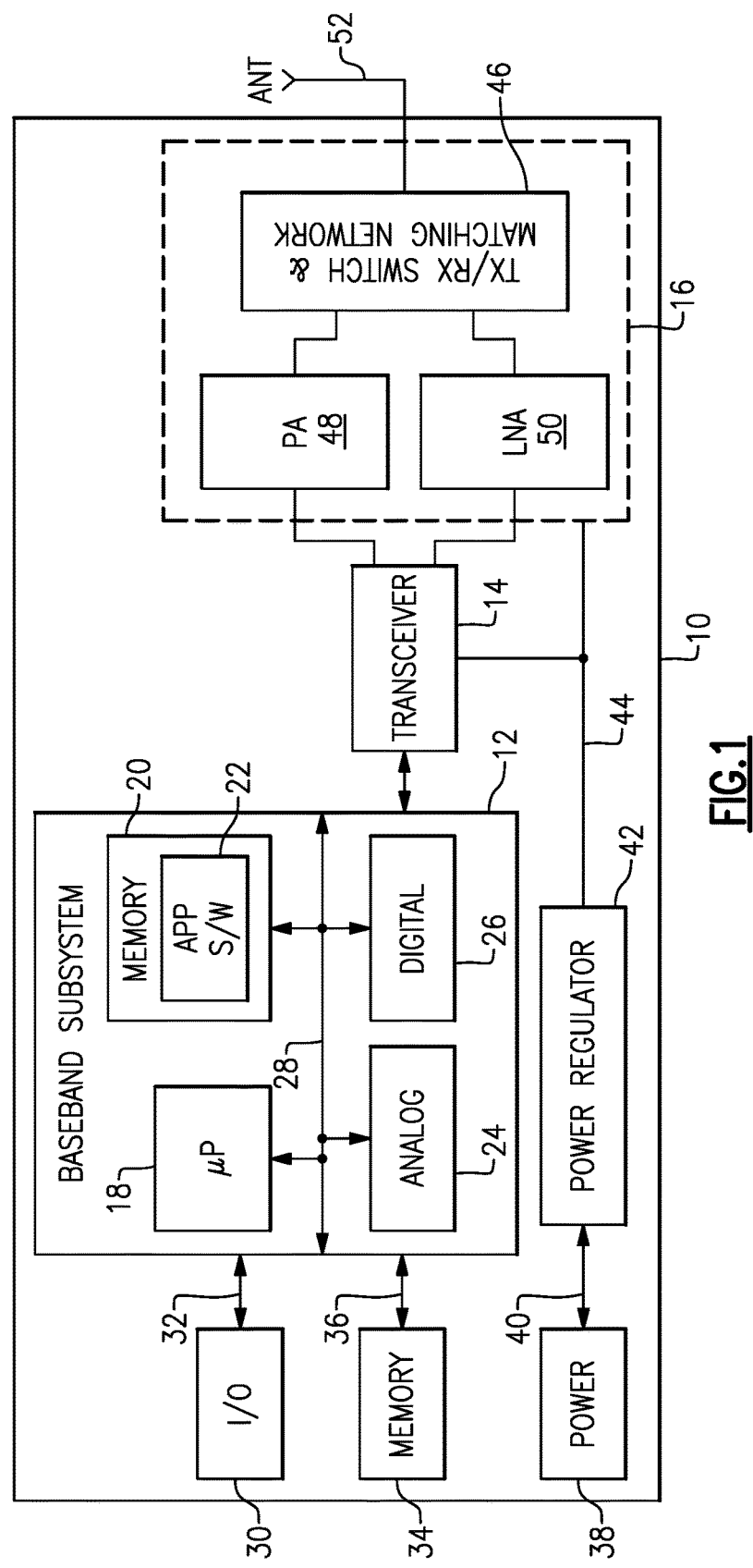
FIG. 1 a block diagram of an exemplary wireless communications device that may incorporate a power detector in accordance with the present disclosure.

FIG. 1 illustrates a simplified wireless communications device 10 in which various embodiments of the power detector in accordance with the present disclosure may be incorporated. In various embodiments, the wireless communications device 10 can be a cellular telephone. However, the low noise amplifier circuit may be utilized in any wireless device with signal reception capabilities. The wireless communications device 10 illustrated in FIG. 1 is intended to be a simplified example of a cellular telephone and to illustrate one of many possible applications in which the low noise amplifier circuit can be implemented. One having ordinary skill in the art will understand the operation of a cellular telephone, and, as such, implementation details are omitted.

The wireless communications device 10 includes a baseband subsystem 12, a transceiver 14, and a front end module 16. Although omitted from FIG. 1, the transceiver 14 includes modulation and upconversion circuitry for preparing a baseband information signal for amplification and transmission, and includes filtering and downconversion circuitry for receiving and downconverting a radio frequency signal to a baseband information signal to recover data. The details of the operation of the transceiver 14 are known to those skilled in the art.

The baseband subsystem 12 generally includes a processor 18, which can be a general purpose or special purpose microprocessor, memory 20, application software 22, analog circuit elements 24, and digital circuit elements 26, connected over a system bus 28. The system bus 28 can include the physical and logical connections to couple the above-described elements together and enable their interoperability.

An input/output (I/O) element 30 is connected to the baseband subsystem 12 over a connection 32, a memory element 34 is coupled to the baseband subsystem 12 over a connection 36 and a power source 38 is connected to the baseband subsystem 12 over connection 40. The I/O element 30 can include, for example, a microphone, a keypad, a speaker, a pointing device, user interface control elements, and any other device or system that allows a user to provide input commands and receive outputs from the wireless communications device 10.

The memory 20 can be any type of volatile or non-volatile memory, and in an embodiment, can include flash memory. The memory element 34 can be permanently installed in the wireless communications device 10, or can be a removable memory element, such as a removable memory card.

The power source 38 can be, for example, a battery, or other rechargeable power source, or can be an adaptor that converts AC power to the correct voltage used by the wireless communications device 10. In an embodiment, the power source can be a battery that provides a nominal voltage output of approximately 3.6 volts (V). However, the output voltage range of the power source can range from approximately 3.0 to 6.0 V. As will be appreciated, the power source 38 or battery may output a voltage level higher than what is needed by the components of the wireless communications device 10 at full charge, and gradually reduce the voltage level as it is discharged. Accordingly, there may be a separate central power regulator 42 that stabilizes or regulates the voltage level, then distributes the same to each of the components of the wireless communications device 10. Each of the subsystems and/or components may be connected to the central power regulator 42 over a power bus 44. Alternatively, each subsystem may have a separate power regulation circuit, as different components may have varying source power stability requirements.

The processor 18 can be any processor that executes the application software 22 to control the operation and functionality of the wireless communications device 10. The memory 20 can be volatile or non-volatile memory, and in an embodiment, can be non-volatile memory that stores the application software 22.

The analog circuit elements 24 and the digital circuit elements 26 include the signal processing, signal conversion, and logic that convert an input signal provided by the I/O element 30 to an information signal that is to be transmitted. Similarly, the analog circuit elements 24 and the digital circuit elements 26 include the signal processing, signal conversion, and logic that convert a received signal provided by the transceiver 14 to an information signal that contains recovered information. The digital circuit elements 26 can include, for example, a Digital Signal Processor (DSP), a Field Programmable Gate Array (FPGA), or any other processing device. Because the baseband subsystem 12 includes both analog and digital elements, it is sometimes referred to as a mixed signal circuit.

The front end module 16 is generally comprised of components belonging to a transmit signal chain, components belonging to a receive signal chain, and a switch 46. For purposes of simplification, the transmit signal chain is generally represented by a power amplifier 48, while the receive signal chain is generally represented by a low noise amplifier 50. The switch 46 interconnects the power amplifier 48 and the low noise amplifier 50 to an antenna 52. The front end module 16 depicted in FIG. 1 is understood to be for a single wireless operating mode, and those having ordinary skill in the art will appreciate that a conventional wireless communications device 10 has multiple wireless operating modes conforming to different standards. Accordingly, there may be multiple front end modules 16 particularly configured for each operating mode, or one front end module 16 with multiple constituent components for each operating mode. Along these lines, these different operating modes may utilize more than one antenna at a time (diversity mode operation), so the single antenna 52 is presented by way of example only and not of limitation.

Figure 2:
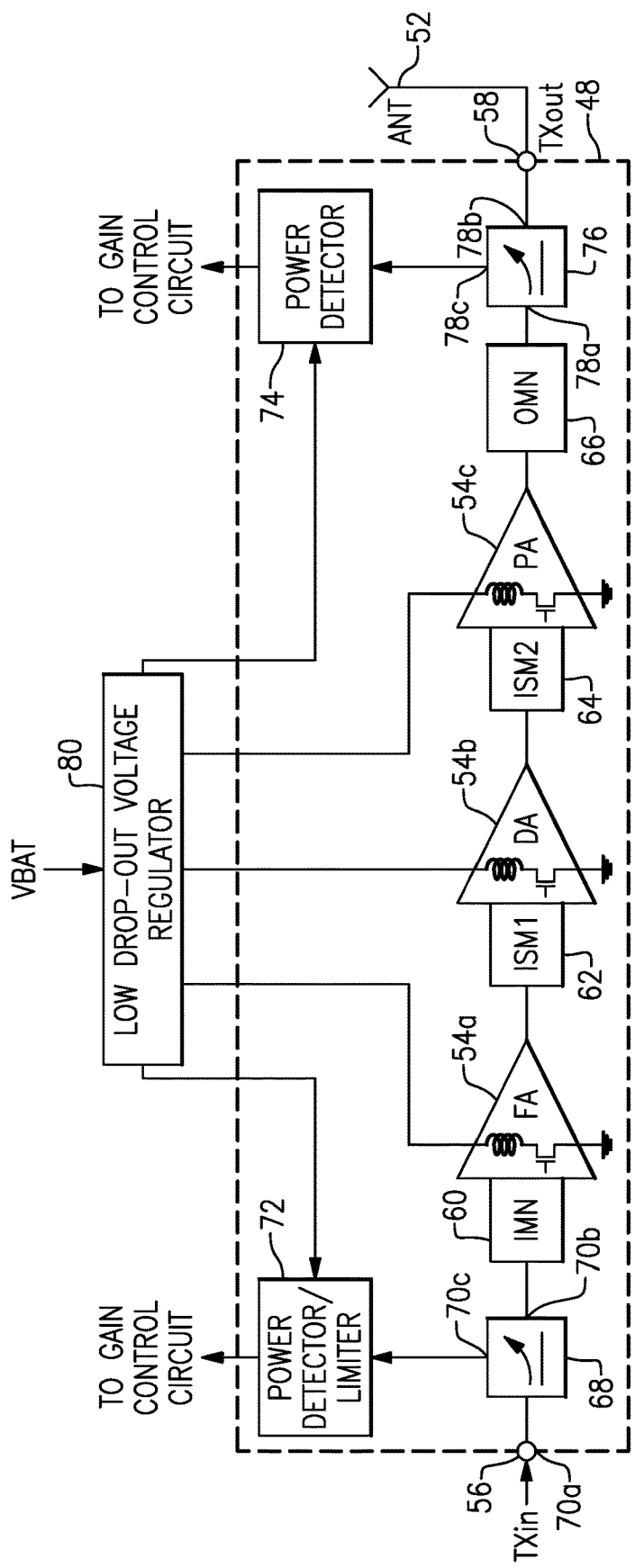
FIG. 2 is a block diagram of an exemplary multi-stage power amplifier circuit with which the disclosed power detector may be utilized.

As discussed earlier, monitoring the power levels of the signal generated by the power amplifier 48 helps improve its performance, and accordingly, the present disclosure contemplates various power detectors to this end. With reference to the schematic diagram of FIG. 2, the power amplifier 48 may be comprised of three stages, including a first amplifier stage 54a, a driver amplifier stage 54b, and a power amplifier stage 48c.

A radio frequency signal generated by the transceiver 14 is passed to a power amplifier input 56 and sequentially amplified in stages to be output from a power amplifier output 58. The first amplifier stage 54a is typically a voltage amplification stage, with ensures that the radio frequency signal from the transceiver 14 has adequate voltage for the subsequent amplification stages. The driver amplifier stage 54b is understood to increase current for further power amplification by the power amplifier stage 54c.

The first amplifier stage 54a may include an input matching network 60 that impedance matches the power amplifier 48 to the transceiver 14. Along these lines, the driver amplifier stage 54b may include a first inter-stage matching network 62, which impedance matches the driver amplifier stage 54b to the first amplifier stage 54a. Additionally, the power amplifier stage 54c includes a second inter-stage matching network 64 that similarly impedance matches the power amplifier stage 54c to the driver amplifier stage 54b. The output of the power amplifier stage 54c is connected to an output matching network 66 that impedances matches the power amplifier stage 54c to the antenna 52 and/or the switch 46 mentioned earlier.

In accordance with various embodiments of the present disclosure, measurements of the power levels at either or both the power amplifier input 56 and the power amplifier output 58 may be taken. Thus, the power amplifier 48 may include a first directional coupler 68 with an input port 70a connected to the power amplifier input 56, a transmitting port 70b connected to the input matching network 60, and a coupled or detector port 70c connected to an input power detector 72, which may also include a power limiter. As will be described in further detail below, a power detector is understood to generate a direct current (DC) voltage level that corresponds to the power level of an input RF signal. In this regard, the output of the input power detector 72 may be connected to a gain control circuit that may be implemented in, for example, the transceiver 14.

Various embodiments of the present disclosure also contemplate measuring the power levels output from the power amplifier 48, and accordingly there may be an output power detector 74. There is likewise a second directional coupler 76 that has an input port 78a connected to the output of the output matching network 66 and the power amplifier stage 54c, as well as a transmitting port 78b connected to the power amplifier output 58. A coupled or detector port 78c is connected to the output power detector 74. Like the input power detector 72, the output power detector 74 generates a DC voltage corresponding to the power level of the RF signal as amplified by the first amplifier stage 54*a*, the driver amplifier stage 54*b*, and the power amplifier stage 54*c*, which is passed to the antenna 52. The DC voltage output from the output power detector 74 is passed to a gain control circuit.

While some embodiments of the disclosed power detectors 72, 74 may specifically reference the output power detector 74, this is by way of example only and not of limitation. The features of the output power detector 74 may find equal utility and applicability in the input power detector 72, and may be readily incorporated without departing from the scope of the present disclosure. Along these lines, while the present disclosure makes reference to the use of the power detectors for the power amplifier 48, it will also be appreciated that similar power detectors may be utilized for the low noise amplifier 50 and input signals received from the antenna 52.

The bias voltage of each of the aforementioned amplifier stages 54*a*-54*c* may be provided by a low dropout (LDO) voltage regulator 80, which is connected to the power source 38, and maintains the output voltage at a set value. The LDO voltage regulator 80 is understood to provide a steady voltage supply to the power detectors 72, 74 as well.

Figure 3:
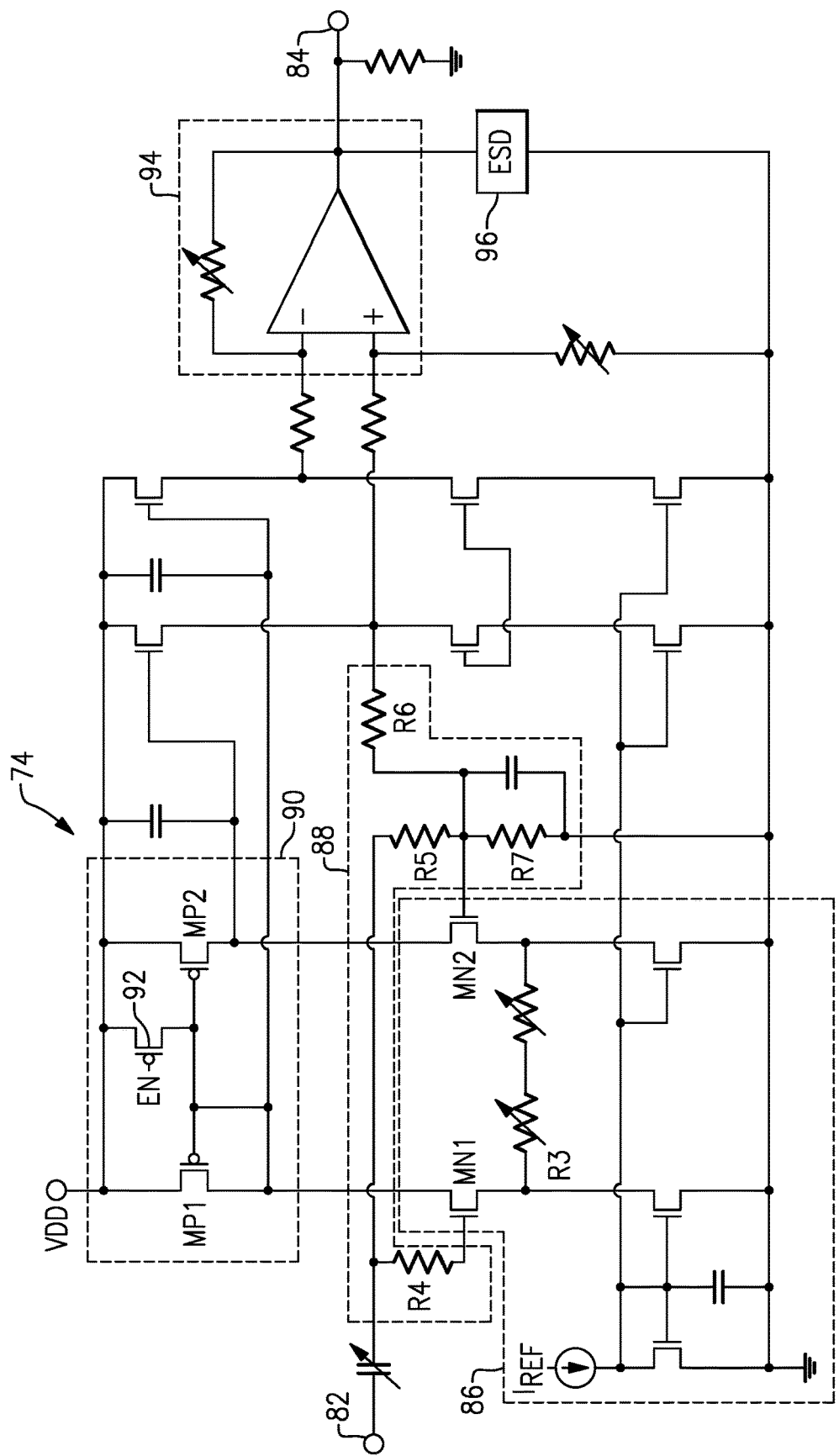
FIG. 3 is a schematic diagram of a first embodiment of the power detector.

Referring now to the schematic diagram of FIG. 3, a first embodiment of the power detector 74 has a detection signal input 82 that is connectable to a source of a RF signal, which in accordance with the foregoing, may be the power amplifier 48. Additionally, the power detector 74 has a detected power level output 84, which as discussed above, may be connected to an amplifier gain control circuit.

The power detector 74, which operates in current mode, includes a differential amplifier detector circuit 86 with an input that is connected to the detection signal input 82, and an output that is connected to the detected power level output 84. In further detail, the differential amplifier detector circuit 86 has a first differential amplifier transistor MN1 with a gate that corresponds to one of the differential inputs, as well as a second differential amplifier transistor MN2 likewise with a gate that correspond to another one of the differential inputs. A negative feedback resistor R3 is connected between the first differential amplifier transistor MN1 and the second differential amplifier transistor MN2. It is understood that the negative feedback resistor R3 controls the gain of the differential amplifier detector circuit 86.

The gate of the first differential amplifier transistor MN1 is connected to the detection signal input 82 via a resistor R4, while the gate of the second differential amplifier transistor MN2 is connected to the detection signal input 82 via a resistor R6. The gate of the transistor MN1 is also connected to a resistor R7, as well as a resistor R6. In this regard, the resistors R4, R5, R6, and R7 are understood to define a feedback network 88 that stabilizes the output DC voltage from the differential amplifier detector circuit 86 across semiconductor die fabrication process variations, power supply voltage variations, and temperature variations.

The power detector 74 also includes a mirror circuit 90 that is connected to the differential amplifier detector circuit 86. Specifically, the mirror circuit 90 has a first mirror transistor MP1 that is connected to the first differential amplifier transistor M1, and a second mirror transistor MP2 that is connected to the second differential amplifier transistor M2. The mirror transistors MP1 and MP2 are controlled by an enable transistor 92, which is connected to the respective gates of the first and second mirror transistors MP1 and MP2. The mirror transistors MP1 and MP2, as well as the enable transistor 92, are biased with voltage from a power supply input Vdd, as are the differential amplifier transistors MN1 and MN2 selectively via the mirror transistors MP1 and MP2.

The power detector 74 is understood to mirror and integrate the root-mean-square (RMS) current, which tracks the input power of the RF input signal. The RMS current is charged injected into the capacitor, and the DC voltage corresponding to the input power of the RF input signal is generated. The aforementioned first and second mirror transistors MP1 and MP2 are contemplated to increase the dynamic range of detection, particularly at low forward power.

The DC voltage generated by the power detector 74 may be within a predetermined voltage range bounded by a low end and a high end. At the low end, the DC voltage may be greater than zero, though some gain control circuits expect the low end voltage to begin from zero. In this regard, the power detector 74 further includes a subtractor circuit 94 that reduces the output DC voltage by a predetermined amount such that the low end of the voltage range becomes zero. The subtractor circuit 94 may be tuned to adjust the overall gain and the linear response of the power detector 74. The output of the subtractor circuit 94 may also be connected to an electrostatic discharge circuit 96.

Figure 4:
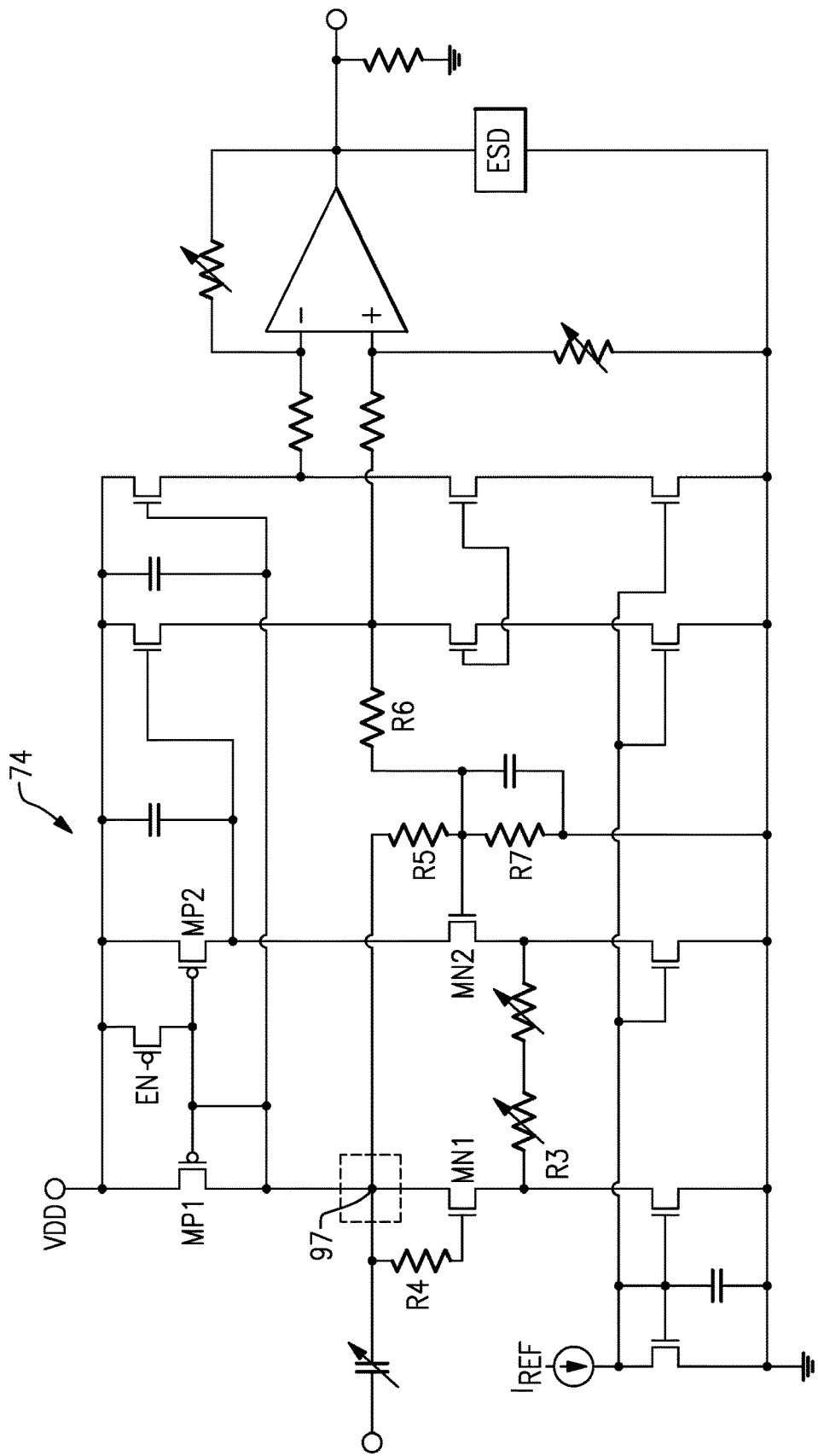
FIG. 4 is a schematic diagram of a second embodiment of the power detector in which a first one of the differential amplifier transistors is connected as a diode.
Figure 5:
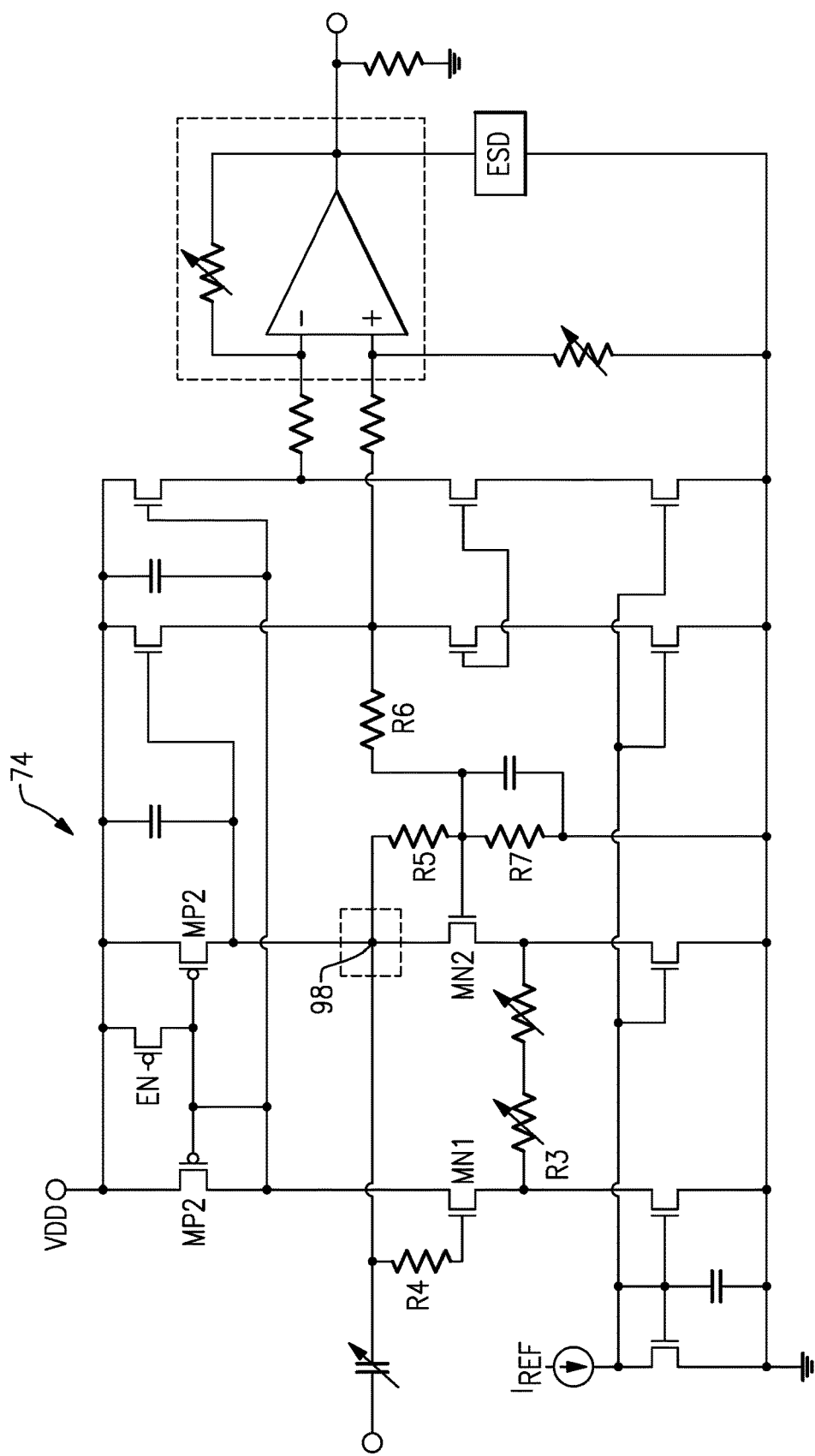
FIG. 5 is a schematic diagram of a third embodiment of the power detector in which a second one of the differential amplifier transistors is connected as a diode.

Referring to the alternative embodiment of the power detector 74 shown in FIG. 4, it is also possible to connect the first differential amplifier transistor M1 in a diode configuration, which involves connecting the gate to the drain, as shown in an interconnection node 97. FIG. 5 illustrates yet another embodiment of the power detector 74 in which the second differential amplifier transistor M2 is likewise connected in a diode configuration, as shown in an interconnection node 98. In all other respects, however, the embodiments of the power detector 74 shown in FIGS. 4 and 5 are identical to the embodiment shown in FIG. 3.

Figure 6:
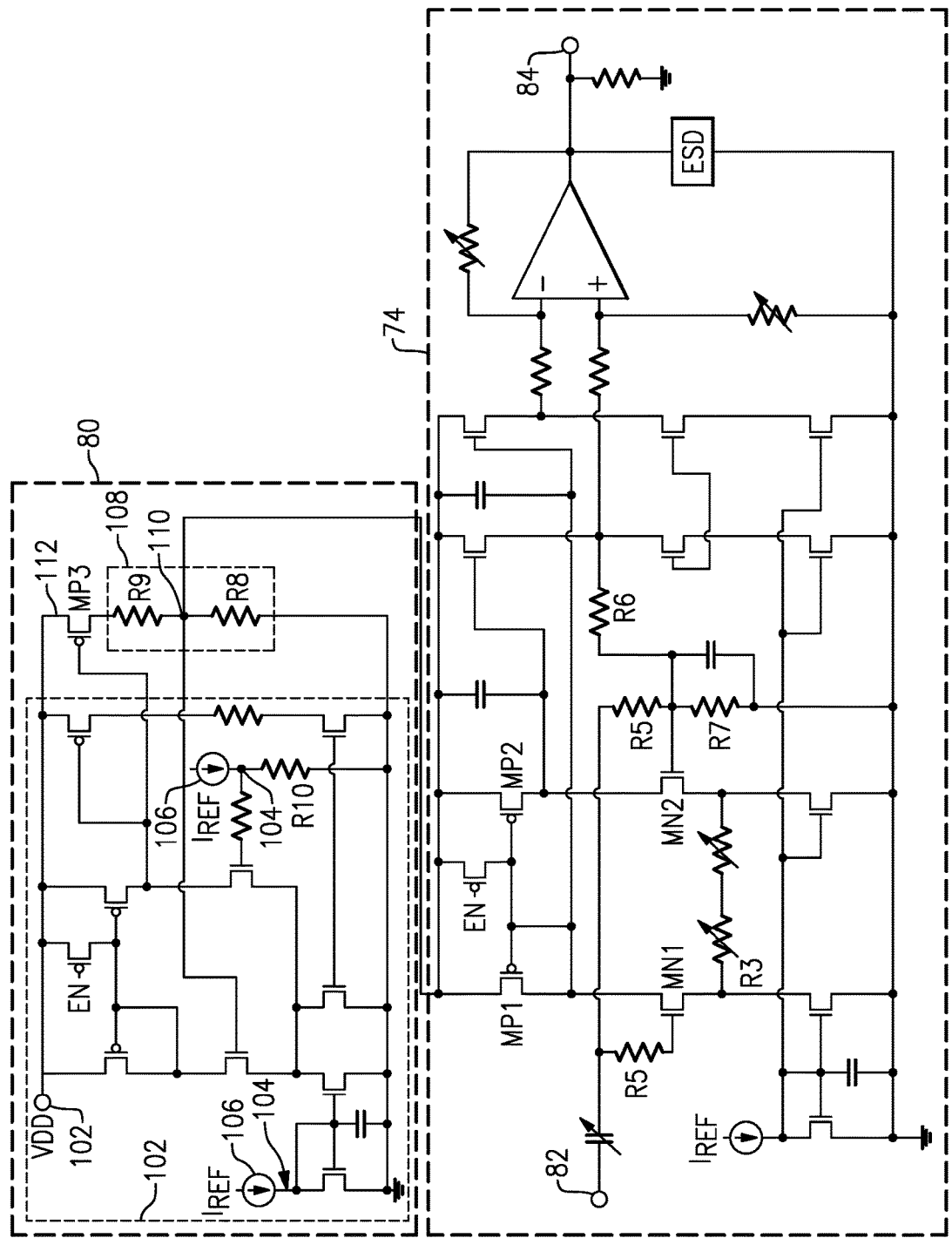
FIG. 6 is a schematic diagram of the power detector connected to a low drop out (LDO) voltage regulator.

With reference to the schematic diagram of FIG. 6 yet another embodiment of the present disclosure is directed to utilizing a small form factor monolithic LDO voltage regulator 80, which is connected to the voltage supply input Vdd of the output power detector 74. The LDO voltage regulator 80 includes an operational amplifier 102. A voltage supply terminal VDD 103 is connected to the power source 38, which is preferably a battery. The operational amplifier 102 includes a reference input 104. A reference voltage setting resistor R10 is connected to the reference input 104 and to a current reference $I_{REF}$ 106.

The LDO voltage regulator 80 further includes a feedback circuit 108 comprised of a resistor R4 and a resistor R3. A junction 110 between the resistor R9 and the resistor R8 corresponds to the output of the LDO voltage regulator 80. The particular values of the resistors R8 and R9 of the feedback circuit 108, as well as the reference voltage setting resistor R10, together with the current reference $I_{REF}$ 106 are understood to define the output voltage of the LDO voltage regulator 80. As is expected of the LDO voltage regulator 80, there is also a pass circuit 112, specifically a pass transistor MP-3 that is connected to the voltage supply terminal VDD 103. The LDO voltage regulator 80 generates a stable voltage supply to the power detector 74. Additionally, this ensures that there is no breakdown, and that there is less variation over a wide range of battery output voltages.

Figure 7:
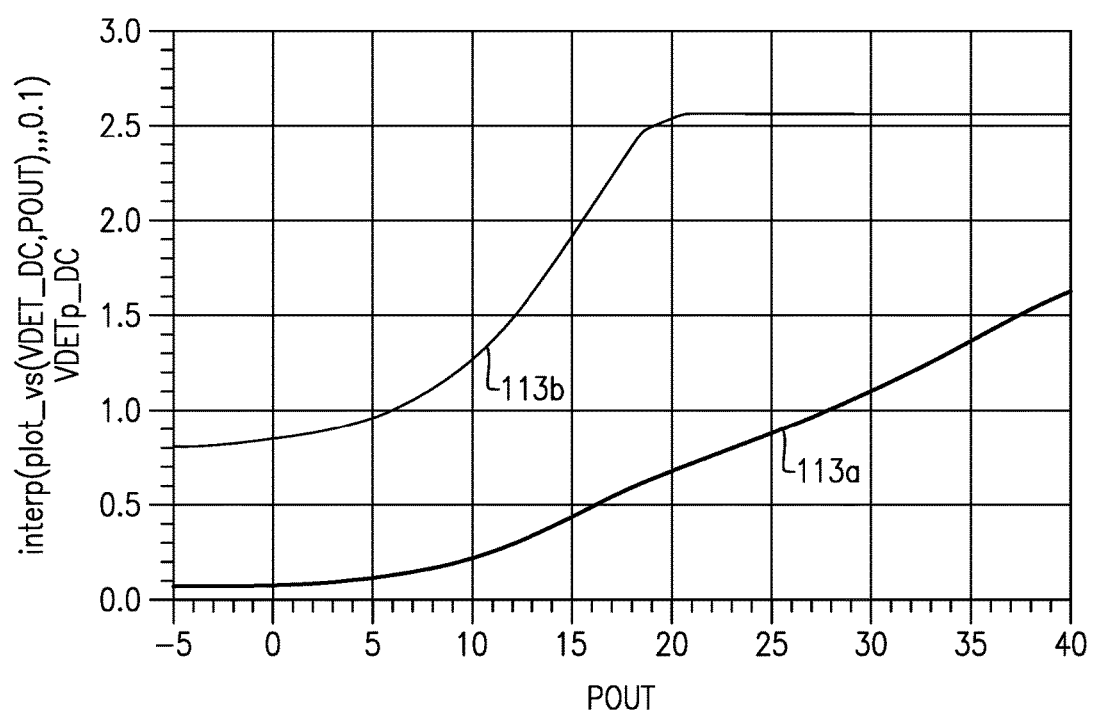
FIG. 7 is a graph plotting output voltages from the power detector of the present disclosure over a frequency sweep, and includes a plot of output voltages from a conventional diode-based detector by way of comparison.

Referring to the graph of FIG. 7, there is illustrated in a first plot 113*a* the simulated DC voltage that is generated by the power detector 74 over an RF input signal power sweep from −5 dB to 40 dBm. A second plot 113*b*, by comparison, shows the simulated DC voltage levels generated by a conventional diode power detector with the same directional coupler 76. As illustrated, the power detector 74 of the present disclosure exhibits a significantly wider dynamic power range.

Figure 8:
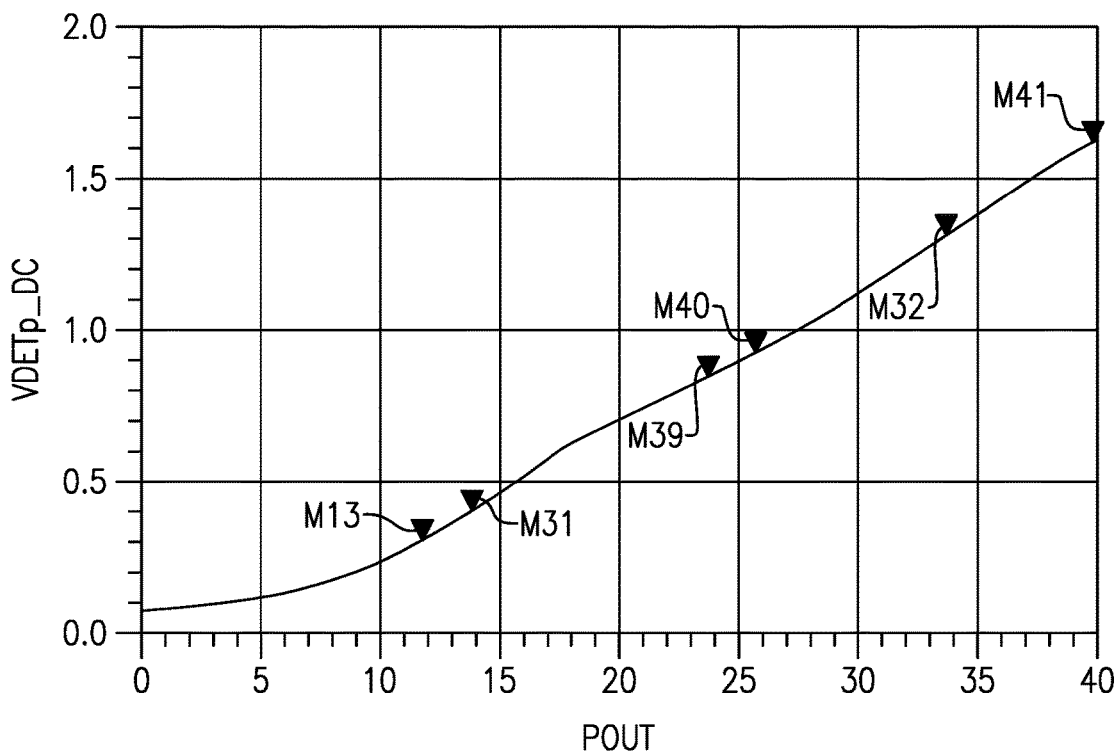
FIG. 8 is a graph plotting the output voltage from the power detector of the present disclosure over an input signal power level sweep.

The graph of FIG. 8 plots the simulated output DC voltage from the power detector 74 over varying battery supply voltages that are regulated by the LDO voltage regulator 80. As shown, with the embodiment of the power detector 74 and the LDO voltage regulator 80 presented in FIG. 6, there is little different in simulated DC voltage output at different battery voltages from 3.6V to 5V.

Figure 9:
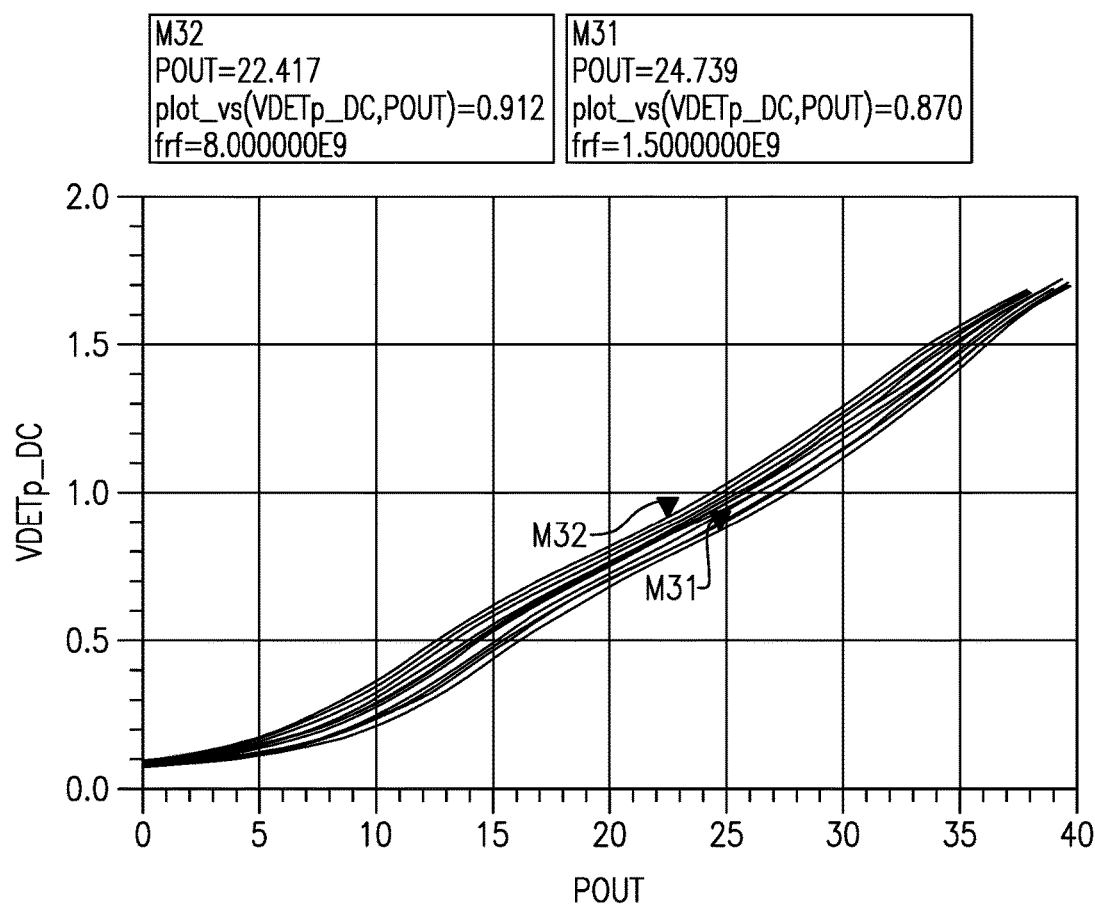
FIG. 9 is a graph plotting the output voltage from the power detector of the present disclosure over an input signal power level sweep for multiple operating frequencies.

The graph of FIG. 9 plots the simulated output DC voltage generated by the power detector 74 for varying operating frequencies from 1.5 GHz to 8 Ghz over an RF input signal power range from 0 dBm to 40 dBm. As shown in plot point m31 for an operating frequency of 1.5 GHz, with the RF input signal power of 24.739 dBm, the power detector 74 outputs a DC voltage of 0.870 V. Further, plot point m32 shows that for an operating frequency of 8 GHz, with the RF input signal with a power 22.4417 dBm, the power detector 74 outputs a DC voltage of 0.912 V. Accordingly, there is understood to be minimal voltage change over a wide frequency range.

Figure 10:
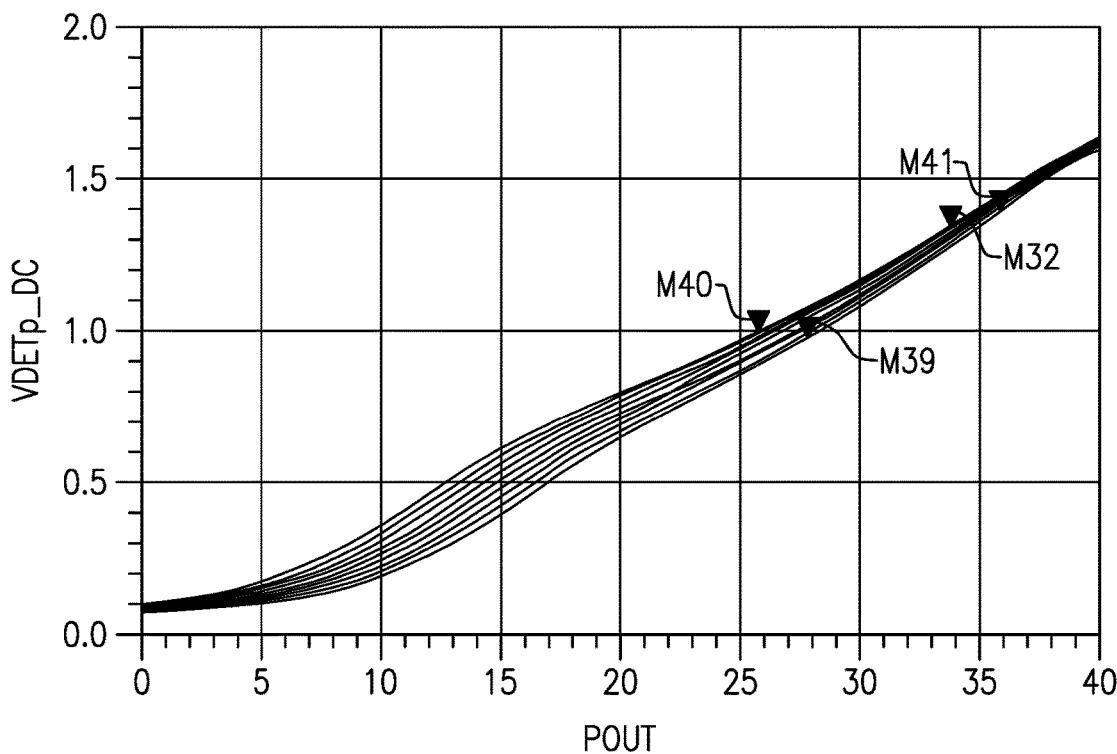
FIG. 10 is a graph plotting the output voltage from the power detector of the present disclosure over an input signal power level sweep for multiple operating temperatures.

Referring to the graph of FIG. 10, the power detector 74 is also understood to operate consistently over a wide ambient temperature range. Specifically, plots of the simulated output DC voltage based upon varying RF input signal power levels from 0 dBm to 40 dBm are shown for multiple ambient temperatures, from −40 degrees Celsius, −20 degrees Celsius, and 120 degrees Celsius. For example, for an RF input signal power of 27.789 dBm at an ambient temperature of 120 degrees Celsius shown in plot point m39, the DC output voltage is 0.975 V. Additionally, for an RF input signal power of 25.775 at an ambient temperature of −40 degrees Celsius shown in plot point m40, the DC output voltage is a comparable 0.994 V. Along the same lines, for an RF input signal power of 35.8 dBm at an ambient temperature of 120 degrees Celsius shown in plot point m41, the DC output voltage is 1.394. A similar output power level of 33.757 dBm but at an ambient temperature of −20 degrees Celsius yields a comparable 1.339 V DC output voltage.

Figure 11:
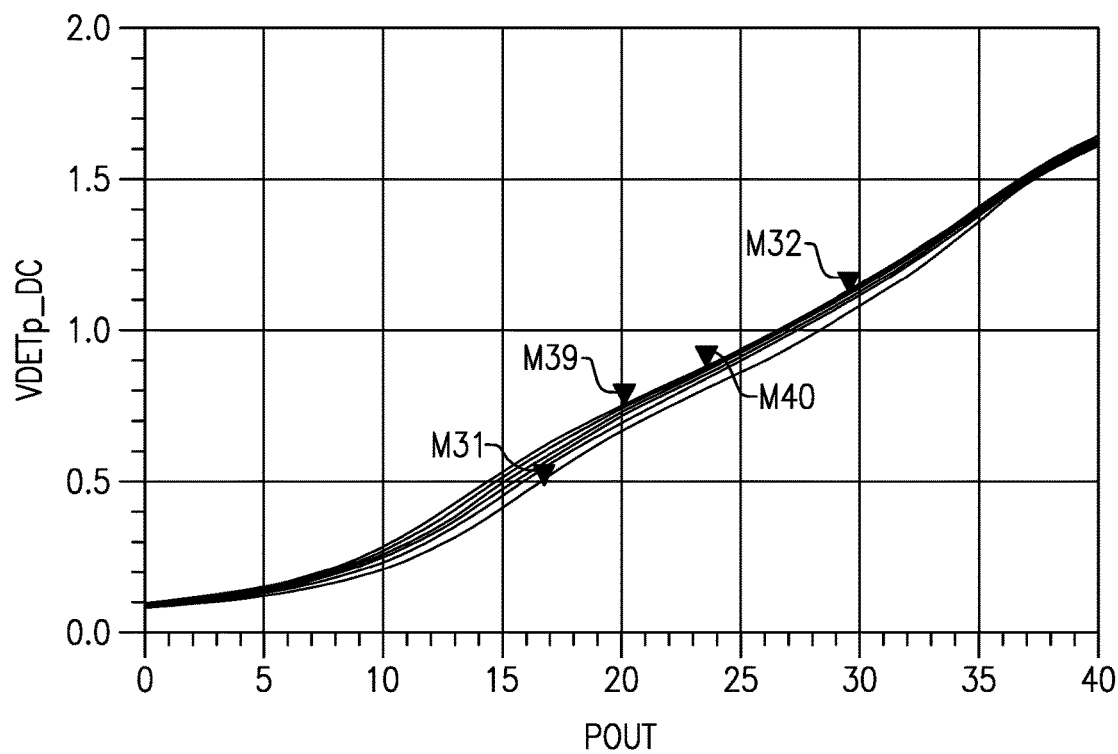
FIG. 11 is a graph plotting the output voltage from the power detector of the present disclosure over an input signal power level sweep for multiple battery supply voltages.

The graph of FIG. 11 plots the simulated DC output voltage from the power detector 74 over different battery supply voltages ranging from 3.6V to 5V, and operating frequencies ranging from 1.5 GHz to 10 GHz. As shown, there is minimal variation over different supply voltages and operating frequencies.

Figure 12:
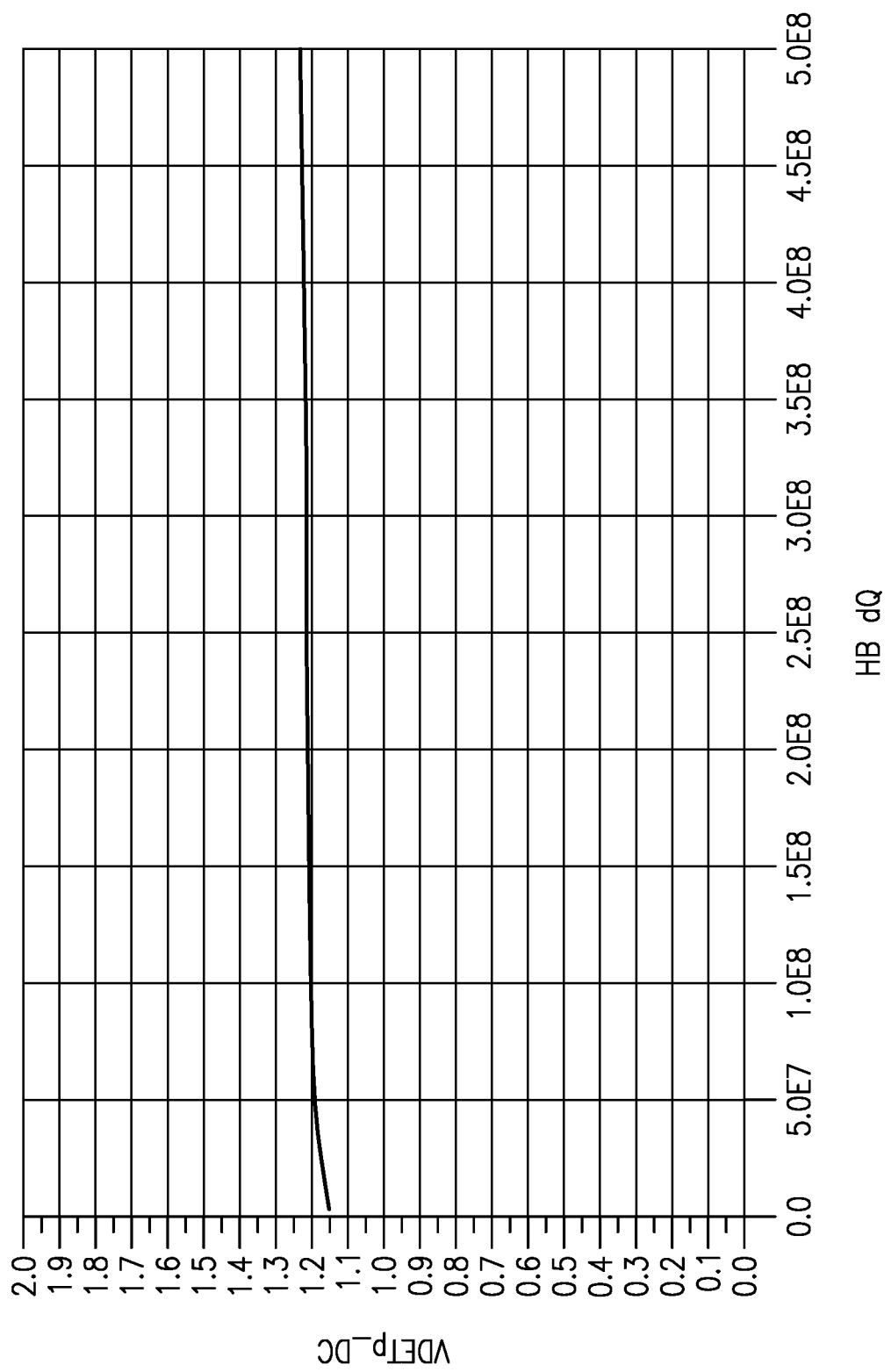
FIG. 12 is a graph plotting the output voltage from the power detector of the present disclosure over a sweep of two-tone frequency spacing dQ.

The graph of FIG. 12 plots the simulated DC output voltage from the power detector 74 of the present disclosure over different two-tone frequency spacing (dQ). In further detail, the RF input signal power is 30 dBm, with a 3 dB bandwidth of greater than 500 MHz. It is expressly contemplated that the power detector 74 may be utilized for peak envelope power measurements for wide band digital and analog modulated signals.

Figure 13:
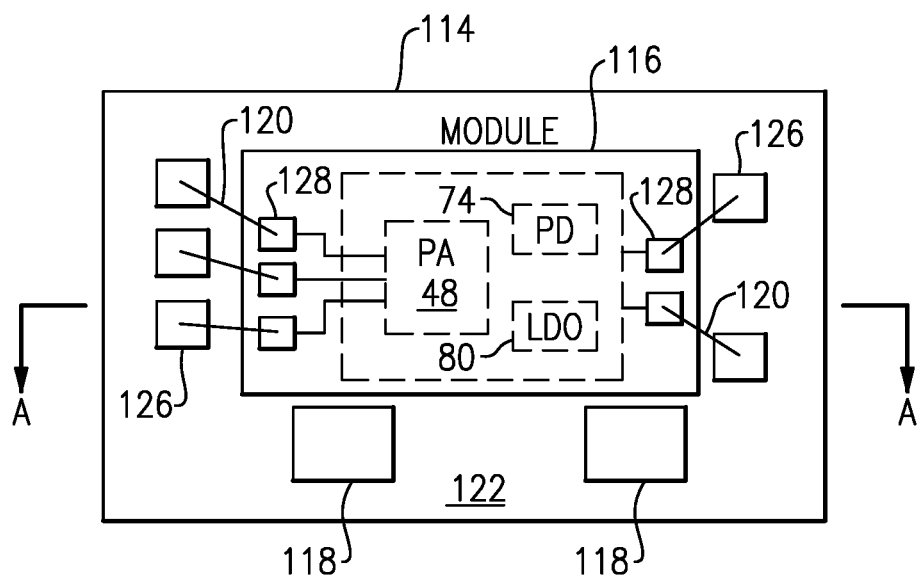
FIG. 13 is a schematic diagram of a packaged front end module.
Figure 14:
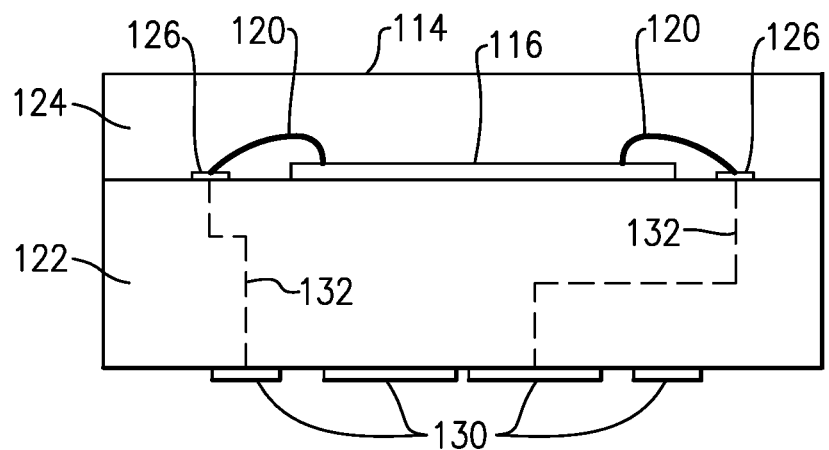
FIG. 14 is a schematic diagram of a cross-section of the packaged front end module shown in FIG. 13.

FIG. 13 is a schematic diagram of an embodiment of a packaged radio frequency communications module 114, while FIG. 14 is a schematic diagram of a cross-section of the packaged radio frequency communications module 114 taken along axis A-A of FIG. 13. The packaged radio frequency communications module 114 includes an integrated circuit or die 116, surface mount components 118, wire bonds 120, a package substrate 122, and an encapsulation structure 124. The package substrate 122 includes pads 126 formed from conductors disposed therein. Additionally, the die 116 includes pads 128, and the wire bonds 120 are used to electrically connect the pads 128 of the die 116 to the pads 126 of the package substrate 122.

The die 116 includes the power amplifier 48, the power detector 74 of the present disclosure, and the LDO voltage regulator 80 formed therein. These components on the die 116 are understood to be as described above, and may be fabricated with complementary metal oxide semiconductor (CMOS) processes, as well as the silicon germanium (SiGe) process, the silicon-on-insulator (SOI) process, gallium arsenide (GaAs), heterojunction bipolar transistor (HBT) processes, and so forth. It is expressly contemplated that the circuitry of the power detector 74 itself occupies a footprint of less than 0.03 mm$^2$ on the die 116.

The die 116 is mounted to the package substrate 122 as shown, though it may be configured to receive a plurality of additional components such as the surface mount components 118. These components include additional integrated circuits as well as passive components such as capacitors, inductors, and resistors.

As shown in FIG. 13, the packaged radio frequency communications module 114 is shown to include a plurality of contact pads 130 disposed on the side of the packaged radio frequency communications module 114 opposite the side used to mount the die 116. Configuring the packaged radio frequency communications module 114 in this manner can aid in connecting the same to a circuit board of the wireless communications device 10. The example contact pads 130 can be configured to provide radio frequency signals, bias signals, power low voltage(s) and or power high voltage(s) to the die 116 and/or the surface mount components 118. The electrical connections between the contact pads 130 and the die 116 can be facilitated by connections 132 through the package substrate 122. The connections 132 can represent electrical paths formed through the package substrate 122, such as connections associated with vias and conductors of a multilayer laminated package substrate.

In some embodiments, the packaged radio frequency communications module 114 can also include or more packaging structures to, for example, provide protection and/or to facilitate handling of the packaged radio frequency communications module 114. Such a packaging structure can include overmold or encapsulation structure 124 formed over the package substrate 122 and the components and die(s) disposed thereon.

It will be understood that although the packaged radio frequency communications module 114 is described in the context of electrical connections based on wire bonds, one or more features of the present disclosure can also be implemented in other packaging configurations, including, for example, flip-chip configurations.

The particulars shown herein are by way of example and for purposes of illustrative discussion of the embodiments of the power detectors and RF front end circuits incorporating the same, and are presented in the cause of providing what is believed to be the most useful and readily understood description of the principles and conceptual aspects. No attempt is made to show details with more particularity than is necessary, the description taken with the drawings making apparent to those skilled in the art how the several forms of the present disclosure may be embodied in practice.

What is claimed is:

1. A power detector with a detection signal input connectable to a source of a radio frequency signal, and a detected power level output, the power detector comprising:

a differential amplifier detector circuit with an input connected to the detection signal input, and an output corresponding to the detected power level output;

a feedback network connected to the input and the output of the differential amplifier detector circuit; and a mirror circuit connected to the differential amplifier detector circuit, a root mean square current corresponding to a power level of the radio frequency signal from the source being mirrored and integrated, with a direct current voltage level being generated therefrom and output to the detected power level output, the direct current voltage being within a first predetermined voltage range between a low end and a high end and corresponding to the power level of the radio frequency signal.

2. The power detector of claim 1 further comprising a subtractor circuit connected to the output of the differential amplifier detector circuit, the direct current voltage level corresponding to the power level of the radio frequency signal being reduced by a predetermined amount to reduce the first predetermined voltage range to have a low end of zero.

3. The power detector of claim 1 wherein the differential amplifier detector circuit includes a first differential amplifier transistor and a second differential amplifier transistor.

4. The power detector of claim 3 wherein the first differential amplifier transistor is connected in a diode configuration.

5. The power detector of claim 3 wherein the second differential amplifier transistor is connected in a diode configuration.

6. The power detector of claim 3 wherein the mirror circuit includes a first mirror transistor connected to the first differential amplifier transistor, and a second mirror transistor connected to the second differential amplifier transistor.

7. The power detector circuit of claim 1 further comprising an electrostatic discharge circuit connected to the output of the differential amplifier detector circuit.

8. A radio frequency front end circuit connectable to a source of a radio frequency signal, the radio frequency front end circuit comprising:

a circuit output connectable to a radio frequency signal destination;

an amplifier circuit implemented and including input and an output, the input being connected to a source of a radio frequency signal;

a power detector including a differential amplifier circuit with a feedback network and a mirror circuit connected thereto, the differential amplifier circuit including an input connected to the output of the amplifier circuit, an output corresponding to the circuit output, a root mean square current corresponding to a power level of the radio frequency signal from the source being mirrored and integrated by the power detector to generate a direct current voltage level output to the circuit output, the direct current voltage being within a first predetermined voltage range between a low end and a high end and corresponding to the power level of the radio frequency signal; and a coupler having a input port connected to the output of the amplifier circuit, a detector port connected to the input of the power detector, and a transmitted port connected to the circuit output.

9. The front end circuit of claim 8 further comprising a low drop out voltage regulator connected to a respective power supply input of the amplifier circuit and the power detector, and outputs a predetermined voltage from a variable voltage electrical power source.

10. The front end circuit of claim 9 wherein the variable voltage electrical power source is a battery.

11. The front end circuit of claim 8 wherein the amplifier circuit is a power amplifier, the radio frequency signal destination is an antenna, and the source of the radio frequency signal is a transceiver circuit.

12. The front end circuit of claim 8 wherein the amplifier circuit is a low noise amplifier, the radio frequency signal destination is a transceiver circuit, and the source of the radio frequency signal is an antenna.

13. The front end circuit of claim 8 further comprising a subtractor circuit connected to the output of the differential amplifier detector circuit, the direct current voltage level corresponding to the power level of the radio frequency signal being reduced by a predetermined amount to reduce the first predetermined voltage range to have a low end of zero.

14. A radio frequency communications device comprising:

a transceiver configured to process radio frequency signals;

an antenna configured to facilitate transmission and reception of the radio frequency signals;

an amplifier connected to the transceiver and the antenna and including an input and an output; and a power detector including a differential amplifier circuit with a feedback network and a mirror circuit connected thereto, the differential amplifier circuit including an input connected to the output of the amplifier, an output corresponding to the circuit output, a root mean square current corresponding to a power level of the radio frequency signal from the source being mirrored and integrated by the power detector to generate a direct current voltage level output to the circuit output, the direct current voltage being within a first predetermined voltage range between a low end and a high end and corresponding to the power level of the radio frequency signal.

15. The radio frequency communications device of claim 14 further comprising a directional coupler with an input port connected to the output of the amplifier, a detection port connected to an input of the power detector, and a transmission port connected to a selected one of the antenna and the amplifier.

16. The radio frequency communications device of claim 15 wherein the amplifier is a low noise amplifier with the transmission port of the directional coupler being connected to the transceiver and the input of the amplifier being connected to the antenna.

17. The radio frequency communications device of claim 15 wherein the amplifier is a power amplifier with the transmission port of the directional coupler being connected to the antenna and the input of the amplifier being connected to the transceiver.

18. The radio frequency communications device of claim 14 wherein the differential amplifier of the power detector includes a first differential amplifier transistor and a second differential amplifier transistor.

19. The radio frequency communications device of claim 18 wherein the first transistor is connected in a diode configuration.

20. The radio frequency communications device of claim 18 wherein the second transistor is connected in a diode configuration.

21. The radio frequency communications device of claim 18 wherein the mirror circuit includes a first mirror transistor connected to the first differential amplifier transistor, and a second mirror transistor connected to the second differential amplifier transistor.

22. The radio frequency communications device of claim 14 further comprising a subtractor circuit connected to the output of the differential amplifier detector circuit, the direct current voltage level corresponding to the power level of the radio frequency signal being reduced by a predetermined amount to reduce the first predetermined voltage range to have a low end of zero.

* * * * *